US012628286B2

(12) United States Patent
Yug

(10) Patent No.: US 12,628,286 B2
(45) Date of Patent: May 12, 2026

(54) SUPPORTING ELEMENT INCLUDING FIBER REINFORCED PLASTICS AND FOLDABLE DISPLAY DEVICE INCLUDING THE SAME

(71) Applicant: Samsung Display Co., LTD., Yongin-si (KR)

(72) Inventor: Geunwoo Yug, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 387 days.

(21) Appl. No.: 18/200,826

(22) Filed: May 23, 2023

(65) Prior Publication Data

US 2024/0057269 A1 Feb. 15, 2024

(30) Foreign Application Priority Data

Aug. 10, 2022 (KR) ......................... 10-2022-0100195

(51) Int. Cl.
H05K 5/00 (2025.01)
H05K 5/02 (2006.01)

(52) U.S. Cl.
CPC ..................................... H05K 5/02 (2013.01)

(58) Field of Classification Search
CPC ...... H05K 5/02; H05K 5/0226; G06F 1/1616; G06F 1/1618; G06F 1/1652; G06F 1/1681; G06F 1/1641; G09F 9/301; G09F 19/18; F16C 11/04; H04M 1/0216; H04M 1/0237; H04M 1/0268; B23K 26/0622
See application file for complete search history.

(56) References Cited

U.S. PATENT DOCUMENTS

| | | | | |
|---|---|---|---|---|
| 10,516,119 B2 * | 12/2019 | Lee | ................... | H10K 59/8731 |
| 11,192,823 B2 * | 12/2021 | Li | ........................ | G06F 1/1633 |
| 11,513,560 B2 * | 11/2022 | Dong | ....................... | B32B 9/04 |
| 11,681,330 B2 * | 6/2023 | Sim | ...................... | G06F 3/0412 |
| | | | | 345/173 |
| 11,955,036 B2 * | 4/2024 | Wang | ..................... | G09F 9/301 |

(Continued)

FOREIGN PATENT DOCUMENTS

| | | |
|---|---|---|
| KR | 1020120006021 | 1/2012 |
| KR | 1020180073742 | 7/2018 |

(Continued)

*Primary Examiner* — Rockshana D Chowdhury
(74) *Attorney, Agent, or Firm* — CANTOR COLBURN LLP

(57) ABSTRACT

A foldable display device includes a display panel including a foldable area folded based on a folding axis, and a supporting member positioning under the display panel and including a folding portion corresponding to the foldable area. The supporting member includes a fiber reinforced plastic, through-holes are defined in the folding portion, each of the through-holes includes an affected zone which is disposed at a boundary of the through-hole and in which a physical or chemical change has occurred at one surface of the supporting member, the folding portion includes a first region including an edge portion contacting the end portion of the supporting member and a second region adjacent to the first region in the folding axis direction, and a width of the affected zone of the through-holes disposed in the first region is different from that of the affected zone of the through-holes disposed in the second region.

17 Claims, 16 Drawing Sheets

(56)  References Cited

U.S. PATENT DOCUMENTS

| | | | |
|---|---|---|---|
| 11,979,995 B2 * | 5/2024 | Jiang | G06F 1/1637 |
| 12,064,944 B2 * | 8/2024 | Zhang | B32B 3/266 |
| 12,130,669 B2 * | 10/2024 | Wang | G02F 1/133 |
| 2020/0273379 A1 * | 8/2020 | Wang | G09F 9/301 |
| 2021/0107829 A1 * | 4/2021 | Chen | G06F 1/1626 |
| 2021/0151697 A1 * | 5/2021 | Cao | G06F 1/1652 |
| 2021/0259119 A1 * | 8/2021 | Seo | H04M 1/0268 |
| 2022/0189349 A1 * | 6/2022 | Roh | B32B 15/08 |
| 2022/0223074 A1 * | 7/2022 | Park | G09F 9/301 |
| 2022/0322542 A1 * | 10/2022 | Wu | G06F 1/1637 |
| 2022/0343809 A1 * | 10/2022 | Chen | G06F 1/1656 |
| 2023/0165039 A1 * | 5/2023 | Yang | H10K 50/844 |
| | | | 361/679.01 |
| 2023/0179690 A1 * | 6/2023 | Lv | G06F 1/1681 |
| | | | 455/566 |
| 2024/0057269 A1 * | 2/2024 | Yug | G06F 1/1616 |
| 2024/0057270 A1 * | 2/2024 | Zhang | B32B 27/281 |
| 2024/0212530 A1 * | 6/2024 | Lee | G06F 1/1652 |
| 2024/0329448 A1 * | 10/2024 | Zhang | G02F 1/1333 |

FOREIGN PATENT DOCUMENTS

| | | |
|---|---|---|
| KR | 1020190136142 | 12/2019 |
| KR | 1020220049066 | 4/2022 |

* cited by examiner (a)

(b)

510a

510a (a)           (b)

—510a

—510b

510c

SUPPORTING ELEMENT INCLUDING FIBER REINFORCED PLASTICS AND FOLDABLE DISPLAY DEVICE INCLUDING THE SAME

This application claims priority to Korean Patent Application No. 10-2022-0100195, filed on Aug. 10, 2022, and all the benefits accruing therefrom under 35 U.S.C. § 119, the content of which in its entirety is herein incorporated by reference.

BACKGROUND

1. Field

The disclosure relates to a display device, and more specifically, to a foldable display device including a fiber reinforced plastic.

2. Description of the Related Art

Electronic devices such as smartphones, mobile phones, tablets, multimedia players, televisions, and monitors include a display device for displaying images. The display device includes a display panel that implements a screen that displays an image. A flexible display device that may be deformable such as bendable, foldable, rollable, and stretchable by including a flexible substrate as a substrate for the display panel is being developed.

Among the flexible display devices, a foldable display device may be folded and unfolded like a book. Such a foldable display device may include fiber reinforced plastics as a support member.

SUMMARY

The foldable display device may include a support member including the fiber reinforced plastic ("FRP"). Since the FRP includes a plurality of fibers, defects in a form of threads may occur due to the fibers being loosened during the manufacturing process of the display device.

Embodiments are for reducing defects occurring in relation to FRP during the manufacturing process of the foldable display device.

A foldable display device in an embodiment includes a display panel including a foldable area that is folded based on a folding axis, and a supporting member disposed under the display panel and including a folding portion corresponding to the foldable area of the display panel. The supporting member includes an FRP, a plurality of through-holes is defined in the folding portion, each of the plurality of through-holes includes an affected zone disposed at a boundary of a through-hole of the plurality of through-holes and in which a physical or chemical change has occurred at one surface of the supporting member, the folding portion includes a first region including an edge portion in contact with an end portion of the supporting member and a second region disposed adjacent to the first region in a folding axis direction, and a width of the affected zone of through-holes of the plurality of through-holes disposed in the first region is different from that of the affected zone of through-holes of the plurality of through-holes disposed in the second region.

In an embodiment, the folding portion may further include a third region adjacent to the second region in the folding axis direction, and the width of the affected zone of the through-holes disposed in the third region may be different from the width of the affected zone of the through-holes disposed in the second region.

In an embodiment, the width of the affected zone of the through-hole disposed in the first region may be within about 10 micrometers (μm) from an incision surface of the through-hole.

In an embodiment, the plurality of through-holes may be formed continuously and extended in the folding axis direction.

In an embodiment, the plurality of through-holes may have a first width in the folding axis direction and a second width in a direction intersecting the folding axis direction, and the first width may be wider than the second width.

In an embodiment, the plurality of through-holes may be in a form of which a half circle is tangential to opposite ends of the rectangle.

In an embodiment, the FRP may include at least one of carbon FRP, glass FRP, graphite FRP, aramid FRP, and hybrid carbon FRP.

A foldable display device in an embodiment includes a display panel including a foldable area that is folded based on a folding axis, and a supporting member disposed under the display panel and including a folding portion corresponding to the foldable area of the display panel. The supporting member includes an FRP, the folding portion includes a plurality of through-holes defined by a laser, the folding portion includes a first region including an edge portion in contact with an end portion of the supporting member and a second region disposed adjacent to the first region in the folding axis direction, and through-holes of the plurality of through-holes defined in the first region and through-holes of the plurality of through-holes defined in the second region are processed by lasers of different pulse energy.

In an embodiment, the through-holes disposed in the first region may be processed with a laser of a first pulse energy, and the through-holes disposed in the second region may be processed with a laser of a second pulse energy, which is a higher energy than the first pulse energy.

In an embodiment, a number of laser scans of the first pulse energy in the first region may be different from a number of laser scans of the second pulse energy in the second region.

In an embodiment, the folding portion may further include a third region adjacent to the second region in the folding axis direction, the through-holes disposed in the first region may be processed by a laser of a first pulse energy, the through-holes disposed in the second region may be processed by a laser of a second pulse energy, which is higher energy than the first pulse energy, and the through-holes disposed in the third region may be processed with a laser of a third pulse energy, which is a higher energy than the second pulse energy.

In an embodiment, a number of laser scans of the first pulse energy in the first region may be greater than a number of laser scans of the second pulse energy in the second region, and a number of laser scans of the third pulse energy in the third region may be smaller than the number of laser scans of the second pulse energy in the second region.

In an embodiment, the FRP may include at least one of carbon FRP, glass FRP, graphite FRP, aramid FRP, and hybrid carbon FRP.

A supporting member in an embodiment includes a folding portion folded based on a folding axis. The supporting member includes an FRP, the folding portion includes a plurality of through-holes defined by a laser processing, each of a plurality of through-holes is disposed at a boundary of the through-hole, and one surface of the supporting member includes an affected zone in which a physical or chemical change has occurred, the folding portion includes a first region including an edge portion in contact with an end portion of the supporting member and a second region disposed adjacent to the first region in the folding axis direction, and a width of the affected zone of the through-holes disposed in the first region is different from that of the affected zone of the through-holes disposed in the second region.

In an embodiment, the folding portion may further include a third region adjacent to the second region in the folding axis direction, and a width of the affected zone of the through-holes disposed in the third region may be different from that of the affected zone of the through-holes disposed in the second region.

In an embodiment, the width of the affected zone of the through-holes disposed in the first region may be within about 10 μm from an incision surface of the through-holes.

In an embodiment, the plurality of through-holes may be formed successively and extended in the folding axis direction.

In an embodiment, the FRP may include at least one of carbon FRP, glass FRP, graphite FRP, aramid FRP, and hybrid carbon FRP.

In an embodiment, the through-holes disposed in the first region may be processed by a laser of a first pulse energy, and the through-holes disposed in the second region may be processed by a laser of a second pulse energy different from the first pulse energy.

In an embodiment, a number of laser scans of the first pulse energy in the first region may be different from a number of laser scans of the second pulse energy in the second region.

By embodiments, it is possible to reduce defects occurring in relation to the FRP during the manufacturing process of the display device. Particularly, it is possible to reduce the occurrence of defects such as a thread cutting at the boundary of the FRP, thereby reducing equipment errors. In addition, in embodiments, since a defect rate is reduced at the edge of the panel, it is possible to increase an edge recognition rate during the bonding process. In addition, it is possible to reduce the defect rate in an appearance inspection at the end of the manufacturing process. Effects of the disclosure is not limited by what is illustrated in the above, and more various effects are included in the specification.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
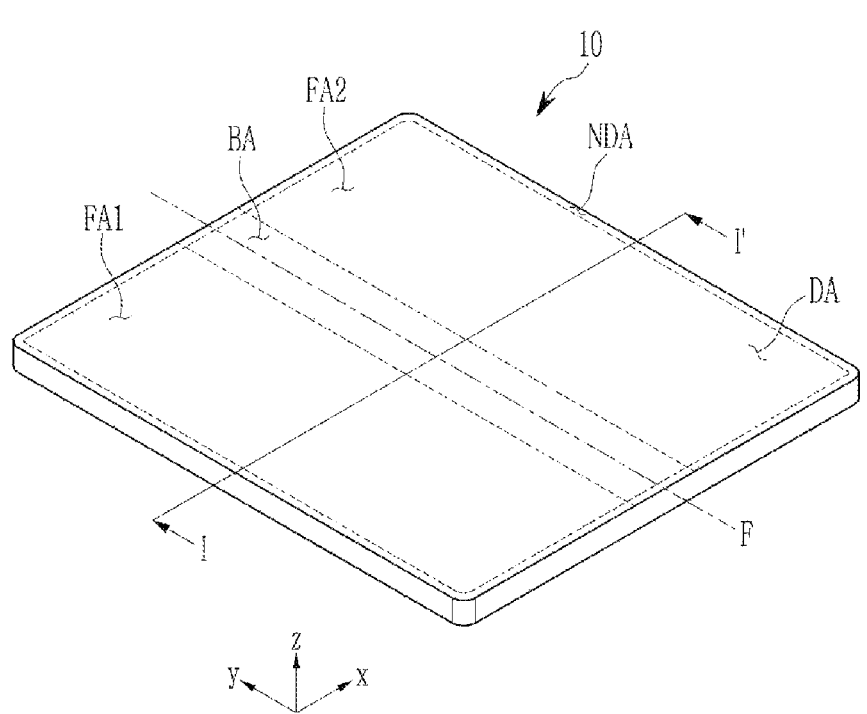
FIG. 1 and FIG. 2 are perspective views of an embodiment of a display device.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

In order to clarify the disclosure, parts that are not connected with the description will be omitted, and the same elements or equivalents are referred to by the same reference numerals throughout the specification.

Further, since sizes and thicknesses of constituent members shown in the accompanying drawings are arbitrarily given for better understanding and ease of description, the disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Throughout the specification, "connected" does not only mean that two or more constituent elements are directly connected, but when two or more constituent elements are connected indirectly through other constituent elements, and it may include a case where substantially integral parts are connected to each other even if they may be referred to by a different name depending on the position or function, as well as the case of being physically connected or electrically connected.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

In the drawings, symbols "x", "y", and "z" representing directions are used, where "x" is a first direction, "y" is a second direction perpendicular to the first direction, and "z" is a third direction perpendicular to the first direction and the second direction.

Further, in the specification, the phrase "in a plan view" means when an object portion is viewed from above, and the phrase "in a cross-section" means when a cross-section taken by vertically cutting an object portion is viewed from the side.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure.

Figure 2:
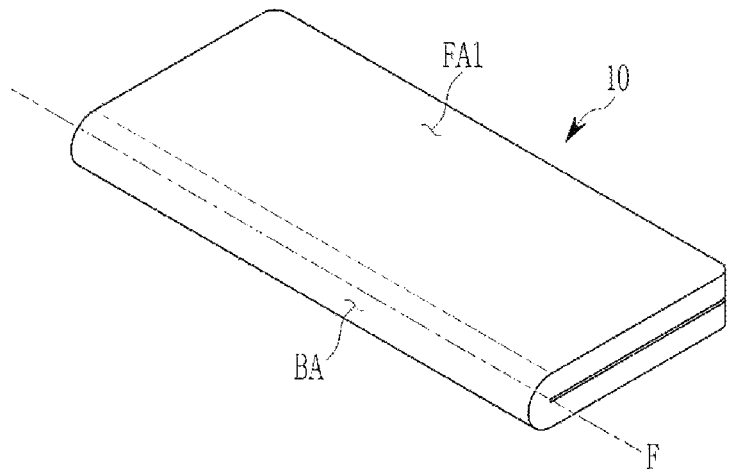

FIG. 1 and FIG. 2 are perspective views showing an embodiment of a display device. FIG. 1 is a perspective view showing an embodiment of an unfolded state of a display device. FIG. 2 is a perspective view showing an embodiment of a folded state of a display device.

In FIG. 1 and FIG. 2, a first direction x may be a direction, e.g., a horizontal direction of the display device 10, parallel to one side of the display device 10 in a plan view. A second direction y is a direction parallel to another side in contact with one side of the display device 10 when viewed in a plan view, and may be a vertical direction of the display device 10. The third direction z may be the thickness direction of the display device 10.

The display device 10 includes a display area DA where an image is displayed and a non-display area NDA excluding the display area DA. The display area DA may be a region displaying an image by including a plurality of pixels. The non-display area NDA is a region that does not include the pixels, and may be disposed around the display area DA.

The display device 10, as shown in FIG. 1, may be unfolded flat as a whole. The display device 10 may include a first flat area FA1, a second flat area FA2, and a foldable area BA between the first flat area FA1 and the second flat area FA2. The foldable area BA is a region that is folded when folding with reference to the folding axis F, and the first flat area FA1 and the second flat area FA2 are non-folding regions. The foldable area BA may be folded around an axis parallel to the second direction y.

In FIG. 1 and FIG. 2, one foldable area BA is shown, however the display device 10 in an embodiment may include at least one foldable area BA. At least one foldable area BA may be folded around different axis from each other, e.g., an axis parallel to the first direction x and/or an axis parallel to the second direction y, and the position and the width of the foldable area BA in the display device 10 may be variously changed.

The display device 10 may maintain both the folded state and the unfolded state. The display device 10 may be folded in an in-folding method in which the display area DA is disposed inside. When the display device 10 is folded in the folding method, the front surfaces of the display device 10 may face each other. That is, the screen portions of the first flat area FA1 and the second flat area FA2 may be folded to face each other. In the folded state, the screen portion of the foldable area BA may be hidden. In an alternative embodiment, the display device 10 may be folded in an out-folding manner in which the display area DA is disposed to the outside. When the display device 10 is folded in the out-folding manner, the rear surfaces of the display device 10 may face each other.

Figure 3:
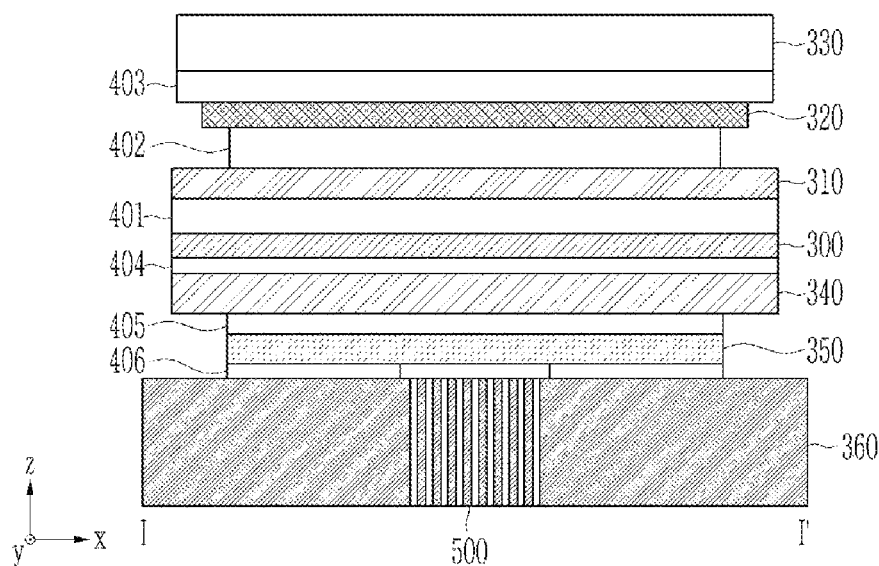
FIG. 3 is a cross-sectional view of a display device taken along line I-I' of FIG. 1.

FIG. 3 is a cross-sectional view of a display device of FIG. 1 taken along line I-I'.

A display device 10 in an embodiment may include a window protection film 330, a window 320, a reflection blocking layer 310, a display panel 300, a protection film 340, a barrier film 350, and a supporting member 360. In an embodiment, the supporting member 360 may be a fiber reinforced plastic ("FRP") panel, for example. Although not shown, it may further include a digitizer layer, a buffer member, and a shielding member.

Each constituent element constituting the display device 10 may be attached by adhesive members 401, 402, 403, 404, 405, and 406. The adhesive members 401, 402, 403, 404, 405, and 406 may be a pressure sensitive adhesive (PSA). The adhesive members 401, 402, 403, 404, 405, and 406 may be a transparent adhesive film (Optically Clear Adhesive, OCA film) or a transparent adhesive resin (Optically Clear Resin, OCR). Each of the adhesive members 401, 402, 403, 404, 405, and 406 may be the same or different.

The reflection blocking layer 310 may be disposed on the front surface on which the image of the display panel 300 is displayed. The reflection blocking layer 310 may be a polarization film including a linear polarizer and a retarder, for example. The reflection blocking layer 310 may have an external light reflection prevention function that blocks light reflected from the inside of the display panel 300 and exiting. The reflection blocking layer 310 may be attached to the front surface of the display panel 300 by the first adhesive member 401 to facilitate the recognition of the image provided from the display panel 300.

The window 320 is disposed on the front surface of the reflection blocking layer 310 to protect the display panel 300. The window 320 may be attached to the front surface of the reflection blocking layer 310 by the second adhesive member 402. The window 320 includes or consists of a transparent material and may include glass or plastic, for example. In an embodiment, the window 320 may include an ultra-thin glass ("UTG") having a thickness of about 0.1 millimeter (mm) or less, a transparent polyimide, polyethylene terephthalate ("PET"), polycarbonate ("PC"), etc., for example.

The window protection film 330 may be disposed on the front surface of the window 320. The window protection film 330 may be attached to the front surface of the window 320 by the third adhesive member 403. The window protection film 330 may perform at least one function among shatter prevention of the window 320, impact absorption, dent prevention, fingerprint prevention, and glare prevention.

The protection film 340 may be disposed on the back surface of the display panel 300. The protection film 340 may be attached to the rear surface of the display panel 300 by the fourth adhesive member 404. The protection film 340 may support the display panel 300 and serve to protect the rear surface of the display panel 300.

The barrier film 350 may be disposed on the rear surface of the protection film 340. The barrier film 350 may be attached to the back surface of the protection film 340 by the fifth adhesive member 405. The barrier film 350 may prevent a penetration of moisture and oxygen from the outside.

To increase the strength and rigidity of the display device 10 on the back surface of the barrier film 350, the supporting member 360 including the FRP may be disposed. The supporting member 360 may be attached to the rear surface of the barrier film 350 by the sixth adhesive member 406.

The sixth adhesive member 406 may not be disposed on the foldable area BA in order to reduce a folding stress when the display device 10 is folded. The sixth adhesive member 406 may be the pressure-sensitive adhesive (PSA). The supporting member 360 may include a folding portion 500 so that the display device 10 may be easily bent in the foldable area BA.

Figure 4:
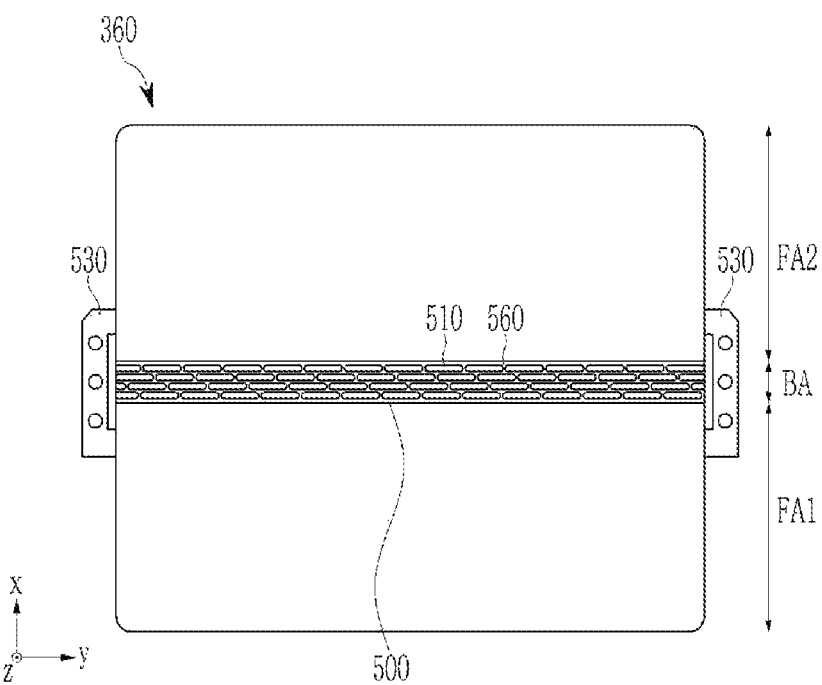
FIG. 4 is a top plan view of an embodiment of a supporting member.

FIG. 4 is a top plan view of an embodiment of a supporting member. The supporting member 360 in an embodiment may have a shape of a rectangle or a square as a whole in a plan view, similar to the shape of the display device 10. It may be a rectangle or square with rounded vertices in the plan view. In an embodiment, the supporting member 360 may be implemented in the form of the quadrangle with rounded corners, but may be implemented in various shapes corresponding to the various shapes of the display device 10.

The supporting member 360 may be an FRP panel. The FRP include a composite material reinforced by mixing carbon fibers, glass fibers, graphite fibers or aramid fibers in a polymer matrix such as epoxy, polyester, polyamide, and vinyl ester, etc. The FRP, e.g., may include at least one of carbon FRP ("CFRP"), glass FRP ("GFRP"), graphite FRP ("GFRP"), aramid FRP ("AFRP"), hybrid carbon FRP ("HFRP"), etc., for example. In an embodiment, the carbon FRP ("CFRP") may include a plurality of carbon fibers extending in one direction and a binding polymer fixing a plurality of carbon fibers, for example.

As such, the FRP consists of a composite of the reinforced fiber material and matrix, and the supporting member 360 including the FRP may be difficult to process such as cutting, piercing, molding, and welding. In addition, problems such as a fiber loosening of the incision surface or equipment errors may occur. The display device 10 in an embodiment may reduce the occurrence of the defects and the equipment errors while using the FRP as the supporting member 360, and shorten the overall process time.

The supporting member 360 including the FRP may be machined using a laser. In an embodiment, when a laser is irradiated to an object, the laser light heats the surface of the object to tens of thousands of degrees, for example. Because a pulse time width is shorter than a thermal diffusion time of the material, heat is accumulated on the surface, and the desired pattern may be processed on the object by the heat generated near the laser irradiation surface. In the case of processing using a laser, since substantially high heat is instantaneously generated, an affected zone in which a physical and/or chemical change occurs on the surface of the object may be generated. In these affected zones, the object may undergo physical changes such as a warping, an expansion, or a contraction of the surface and/or chemical changes that change the composition of the material. In this way, when the surface to be processed is affected by an unwanted heat, the material may be deformed and the processing may deteriorate. The affected zone caused by such heat may be also referred to as a heat affected zone ("HAZ").

When the fiber-reinforced plastic is cut-processed with laser, the incision surface may include the affected zone where the physical and/or chemical changes have occurred at the boundary, and the deformation such as a fiber pulley or a surface shrinkage or a roughening in the affected zone may occur, thereby the deterioration of the processing may be caused.

The supporting member 360 including the FRP may include a folding portion 500 corresponding to the foldable area BA of the display device, and a plurality of through-holes 510 may be defined in the folding portion 500 of the supporting member 360 to facilitate the folding. Referring to FIG. 4, in the foldable area BA, the folding portion 500 in which a plurality of through-holes 510 is defined by laser processing may be disposed. The folding portion 500 may include a lattice pattern, for example. In the case that the through-holes are defined in a lattice pattern, when folding and unfolding by a rib 560 disposed between the through-holes, the folding line in the display area may be relaxed and recognized.

A plurality of through-holes 510 may extends in the direction y parallel to the folding axis F and be continuously defined, and one or more lines of a plurality of through-holes 510 consecutive along the folding axis F may be arranged in the direction x perpendicular to the folding axis F. The through-holes 510 may be disposed in succession along the direction parallel to the folding axis F. The length and the width of the through-holes 510 may be implemented in various ways. In an embodiment, the through-hole 510 may have a first width in the folding axis F and the direction y and a second width in the direction x intersecting the folding axis F, and the first width may be wider than the second width, for example. The through-hole 510 may include various shapes. The through-hole 510 may be a circle, an ellipse, or a polygon such as a quadrangle. Also, a half circle may be tangent to each side of the polygon, or the polygon may have a rounded vertex. In an embodiment, the through-hole 510, as shown in FIG. 4, may be implemented in a form in which a half circle contacts opposite ends of a rectangle, for example.

Since the supporting member 360 includes the above-mentioned folding portion 500 in the foldable area BA, it is possible to reduce the repulsive force caused by the repeated folding and unfolding.

On opposite end portions of the supporting member 360, a handling member 530 extending from the supporting member 360 may be disposed. The handling member 530 may be a handle for logistics. The handling member 530 may be disposed at the end portion where the folding portion 500 of the supporting member 360 ends to prevent the supporting member 360 from being bent in the foldable area BA during the process. The handling member 530 may be removed after the process is complete.

FIG. 5 to FIG. 10 are views showing through-holes and micrographs thereof for each laser processing condition of a supporting member including or consisting of FRP. The quality of the through-holes 510 formed on the supporting member 360 may vary depending on the laser processing conditions. Hereinafter, the through-holes defined for each processing condition according to the difference in the level of the pulse energy of the laser are described together with micrographs. When the laser pulse energy is about 130 microjoules (μJ) or more, it may be defined as a high energy level, and about 25 μJ or less may be defined as a low energy level. An energy level between a low energy level and a high energy level is defined as an intermediate energy level. The laser may pierce the through-hole 510 in the supporting member 360 through repeated scans and form a continuous pattern of them. The number of the laser scans may affect the overall process speed.

Figure 5:
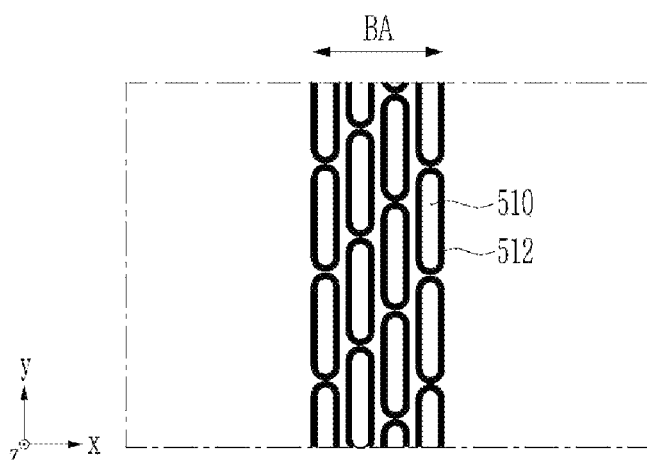
FIG. 5 is a view showing a pattern of through-holes of a supporting member processed by a first laser processing condition.
Figure 6:
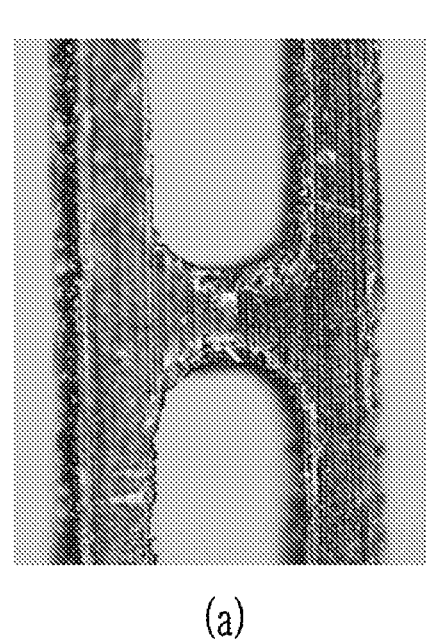
FIG. 6 is a micrograph of through-holes of FIG. 5.
Figure 6:
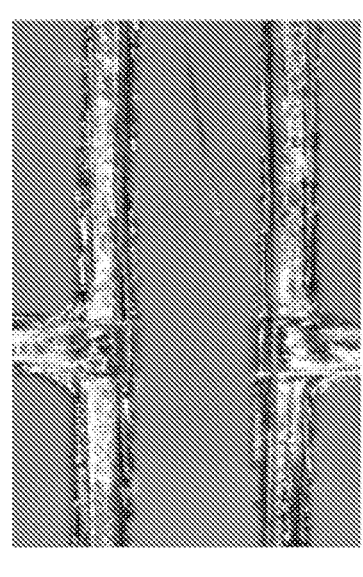

FIG. 5 is a view showing the through-holes in the folding portion of the supporting member processed by the first laser processing condition, and FIG. 6 is a micrograph of the through-hole after the processing in FIG. 5.

The first laser processing condition may be a condition using the laser having the relatively high pulse energy level. In an embodiment, when processing the laser of the high energy with the pulse energy of about 130 μJ or more at a cycle of about 100 kilohertz (kHz) with a relatively low speed, e.g., at a speed of about 800 millimeter per second (mm/s), the through-holes 510 may be defined through approximately 25 repeated laser scans, which is a relatively short number of times, for example. Accordingly, the number and the time of the laser scans may be reduced, and thus the overall process time may be shortened.

Referring to FIG. 5 and FIG. 6, when processing under the first laser processing condition (e.g., the high energy level), the affected zone 512, which has undergone physical or chemical changes at the boundary of the incision surface of the through-hole 510, is disposed to significant places, which may cause deterioration of the through-hole quality. In an embodiment, when the pulse energy is processed with the laser of high energy of about 130 µJ or more, the affected zone 512 may occur over the region having the width of about 100 micrometers (µm) or more from the incision surface at the boundary of the through-hole, for example. The affected zone 512 may cause equipment errors by causing defects in the thread in the subsequent process, and may deteriorate the recognition rate of the edge portion of the display panel.

Figure 7:
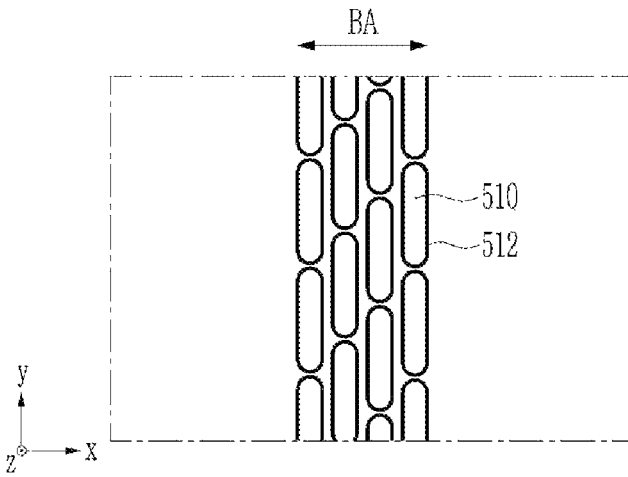
FIG. 7 is a view showing a pattern of through-holes of a supporting member processed by a second laser processing condition.
Figure 8:
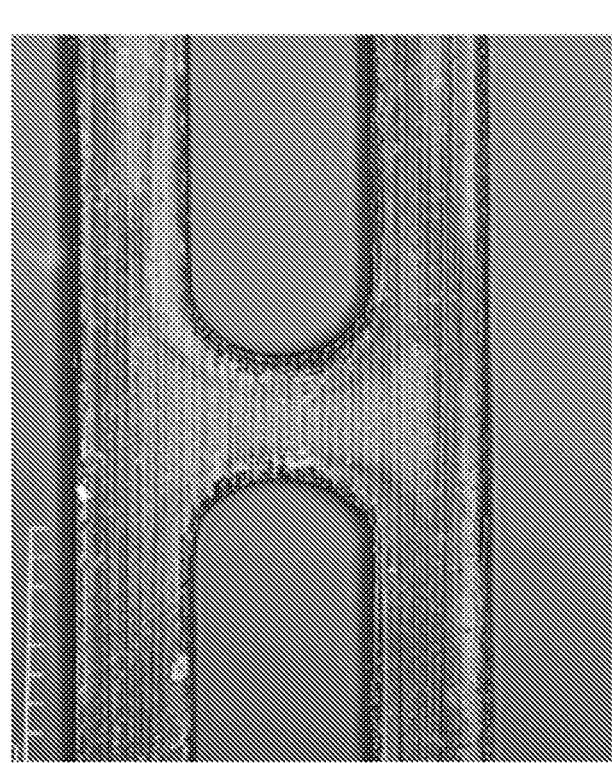
FIG. 8 is a micrograph of through-holes of FIG. 7.

FIG. 7 is the view showing the through-holes in the folding portion of the supporting member processed by the second laser processing condition, and FIG. 8 is the micrograph of the through-hole after the processing of FIG. 7.

The second laser processing condition may be a condition using a laser of a relatively intermediate energy level. In an embodiment, when the laser of the intermediate energy with the pulse energy of about 40 µJ is processed at a cycle of about 300 kHz and a speed of about 1650 mm/s, the through-holes 510 may be defined through approximately 56 repeated laser scans, for example. Therefore, the number of the laser scans may increase compared to the first laser processing condition, and thus the overall process time may increase.

Referring to FIG. 7 and FIG. 8, when processing with the second laser processing condition (e.g., the intermediate energy level), there are some thermal affected zones 512 where physical or chemical changes have occurred at the boundary of the incision surface of the through-hole 510, but the HAZ is included in the relatively small area compared with FIG. 5 and FIG. 6, and thus the relatively high-quality through-holes may be defined. In an embodiment, when the pulse energy is processed with the laser with the intermediate energy level between about 25 µJ to about 130 µJ, the affected zone 512 may occur over a region with the width of about 10 µm to about 100 µm from the incision surface at the boundary of the through-hole, for example.

Figure 9:
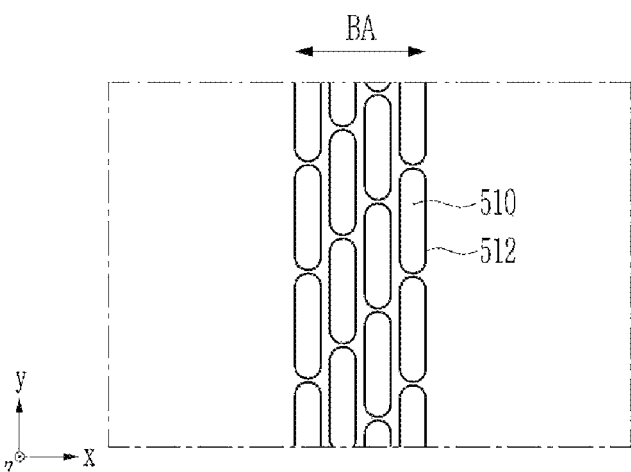
FIG. 9 is a view showing a pattern of through-holes of a supporting member processed by a third laser processing condition.
Figure 10:
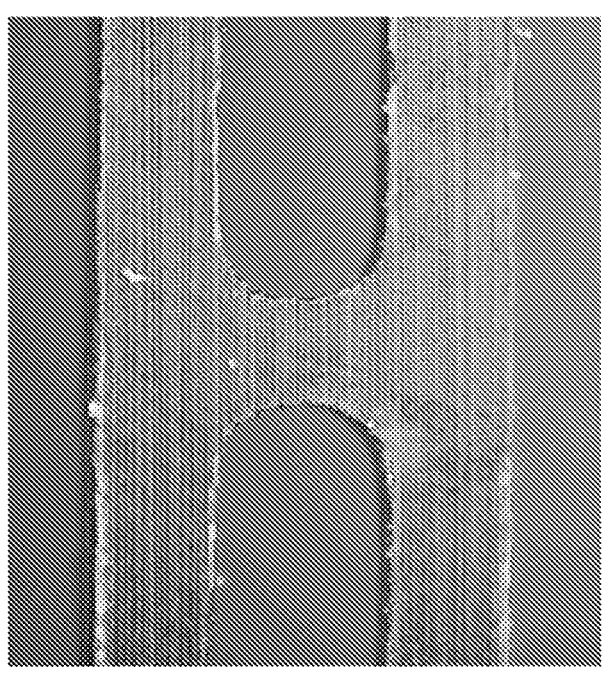
FIG. 10 is a micrograph of through-holes of FIG. 9.

FIG. 9 is the view showing the through-holes in the folding portion of the supporting member processed by the third laser processing condition, and FIG. 10 is the micrograph of the through-hole after the processing of FIG. 9.

The third laser processing condition may be a condition using a laser of a relatively low pulse energy level. In an embodiment, when laser-processing a low energy laser with a pulse energy of about 24 µJ at a cycle of about 500 kHz, e.g., at a speed of about 1650 mm/s, the through-holes 510 may be defined through a relatively large number of the repeated laser scans, approximately 61 times, for example. Therefore, the number of the laser scans increases compared to the first and second laser processing conditions, and thus the overall process time may increase.

Referring to FIG. 9 and FIG. 10, when processing with the third laser processing condition (e.g., the low energy level), at the boundary of the incision surface of the through-hole 510, there is almost no affected zone 512 where physical or chemical changes have occurred, so the high-quality through-holes 510 may be defined. In an embodiment, when processing with the laser with the pulse energy of a low energy level of less than about 25 µJ, the affected zone 512 may occur over a region with the width of about 10 µm or less from the incision surface at the boundary of the through-hole, for example. Therefore, the fairly high-quality through-hole 510 may be defined, which may reduce problems such as the fiber loosening of the incision surface, defects, and equipment errors.

Such laser processing conditions may be variously controlled through the laser pulse energy level and the repetition period, and the material quality and the processing time according to the laser processing conditions are inversely proportional, so it may be changed in various ways. That is, the laser cutting processing may be performed under the different conditions depending on the level of the laser pulse energy, which may affect the process speed and the product quality. Specifically, when processing with the laser of high pulse energy, the number of the laser scans is reduced to increase the through-hole formation speed, but the quality may be deteriorated due to heat. When processing with the low pulse energy laser, the number of the scans of the laser increases and the through-hole formation speed decreases, but the high-quality processing with a clean incision surface may be achieved. This high-quality processing may reduce problems such as the fiber loosening of the incision surface, the defects, and the equipment errors, thereby increasing the overall process efficiency.

Figure 11A:
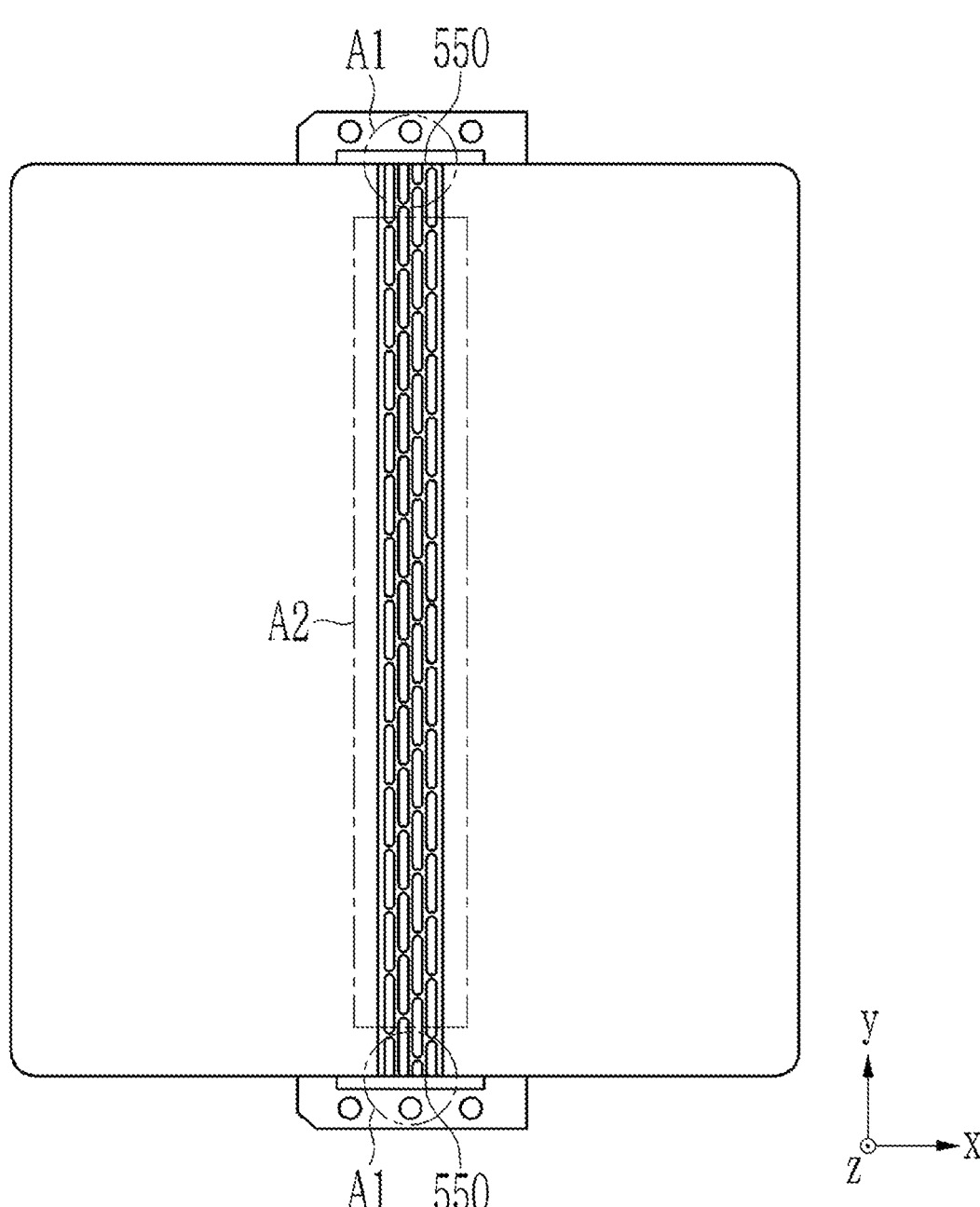
FIG. 11A is a top plan view of an embodiment of a supporting member.
Figure 11B:
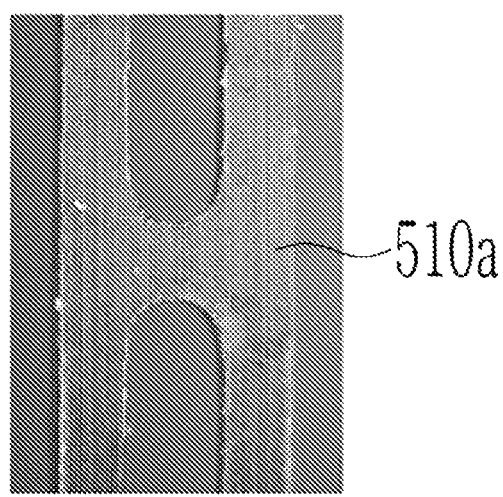
FIGS. 11B and 11C are enlarged views of upper and lower first regions A1 of the supporting member, respectively.
Figure 11C:
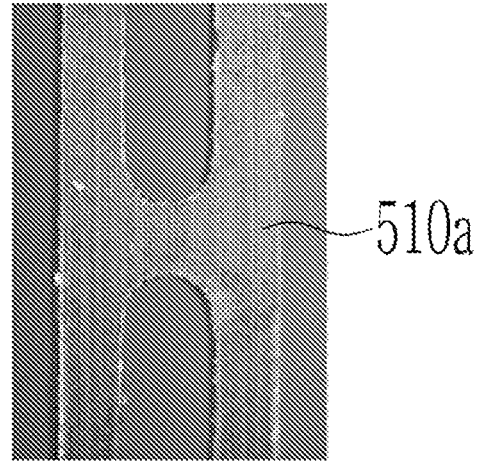
Figure 11D:
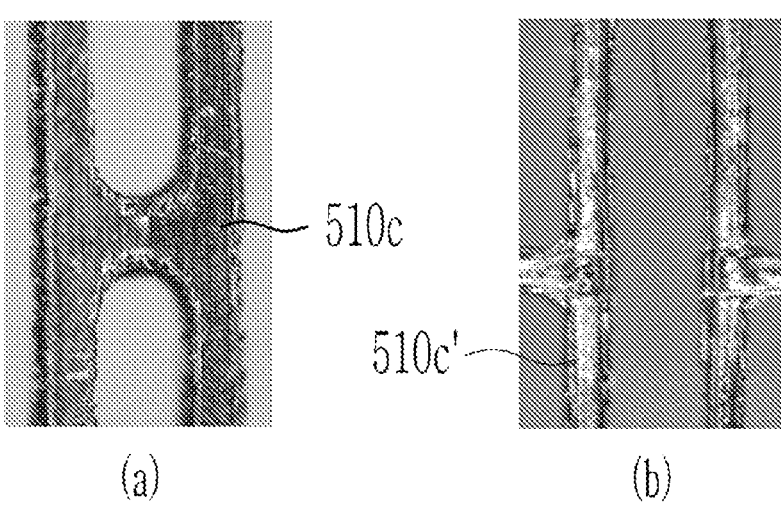
FIG. 11D is an enlarged view of a second region A2 of the supporting member.

FIG. 11A is atop plan view of an embodiment of a supporting member, and FIGS. 11B and 11C are enlarged views of upper and lower areas A1 of the supporting member, respectively, and FIG. 11D is an enlarged view of an area A2 of the supporting member.

The supporting member in an embodiment may be an FRP panel. The supporting member may include an edge portion 550 where the pattern of the through-holes 510a, 510c, and 510c' extending in the folding axis F direction (the Y direction) ends. The supporting member may include a first region A1 including an edge portion 550 at opposite end portions, and a second region A2 disposed adjacent to the first region A1 in the folding axis direction y. The pattern of the through-holes 510a, 510c, and 510c' may be defined in the first region A1 and the second region A2 by differentiating the laser processing conditions, e.g., a value of the laser pulse energy or a number of laser scans. The width of the affected zones disposed at the boundary of the through-holes 510a, 510c, and 510c' defined in each region may be different.

The through-holes 510a using the laser of the lower pulse energy than that of the second region A2 may be defined in the first region A1 including the edge portion 550. Accordingly, the through-holes 510a defined in the first region A1 may hardly include the affected zone in which the physical or chemical change has occurred at the boundary. In an embodiment, the affected zone formed in the through-holes 510a of the first region A1 may occur over the region having the width of about 10 µm or less from the boundary of the through-hole 510a, for example.

In the second region A2 that does not include the edge portion 550, the through-holes 510c and 510c' (respectively shown in (a) and (b) of FIG. 11D) may be defined using the laser having the relatively high energy level. Accordingly, the through-holes 510c and 510c' defined in the second region A2 include the significant portions of the affected zone where the physical or chemical changes have occurred at the boundary, the material quality and the defect rate may increase. That is, the through-holes 510*c* and 510*c*' defined in the second region A2 may include the affected zone having a larger area than the through-hole 510*a* defined in the first region A1. In an embodiment, the affected zone may occur over the region greater than about 100 μm from the boundary of the through-holes 510*c* and 510*c*', for example.

Since the laser of high pulse energy is used in the second region A2 uses to define the through-holes 510*c* and 510*c*', the number of the repeated laser scans may be reduced, and the laser processing speed in the second region A2 may be faster than that of the first region A1.

The through-holes 510*a* disposed in the first region A1 processed with a low energy level laser have the smooth cut portion, which may reduce the defects such as threads related to the fiber material. Specifically, alignment and bonding are performed by recognizing the edge of the panel during a bonding process. When the defect such as a thread splatter occurs in the edge portion 550, an equipment error may occur during the process. Accordingly, it becomes difficult to recognize the edge of the panel in the bonding process, etc., and the equipment error and the product defect rate may increase. In an embodiment, the edge portion 550 uses the laser of low pulse energy to define the through-holes 510*a* of high-quality, so these problems may be solved. In the region not including the edge portion 550, the formation speed of the through-holes 510*c* and 510*c*' may be increased by the laser of relatively high pulse energy.

Therefore, it is possible to increase the yield by reducing the edge defect rate of the display device including the FRP panel as described above, and to increase the productivity by minimizing the occurrence of equipment error, in the region not including the edge portion, the laser processing speed may be increased, so the overall processing speed may be improved.

Figure 12A:
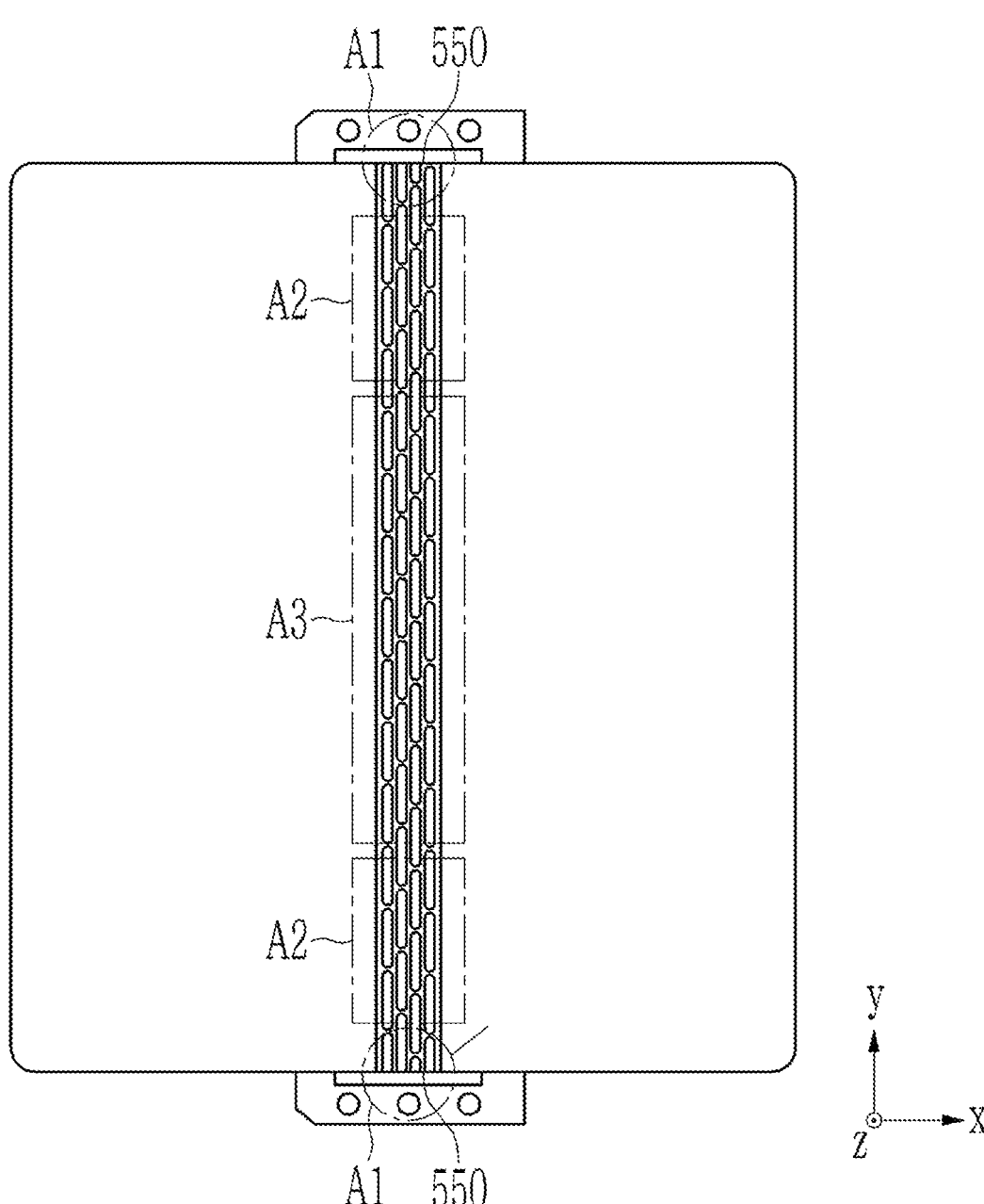
FIG. 12A is a top plan view of an embodiment of a supporting member.
Figure 12B:
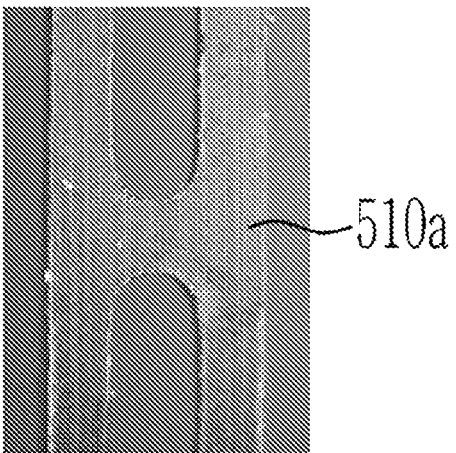
FIGS. 12B, 12C and 12D are enlarged views of first, second and third regions A1, A2 and A3 of the supporting member, respectively.
Figure 12C:
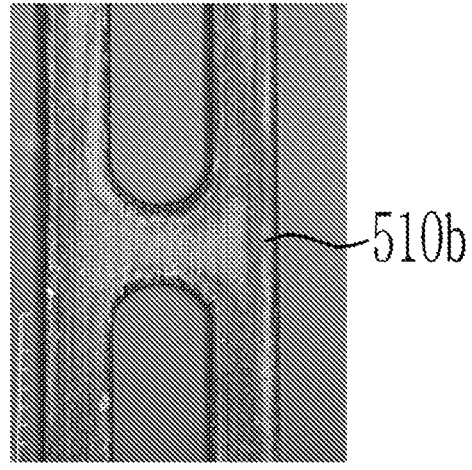
Figure 12D:
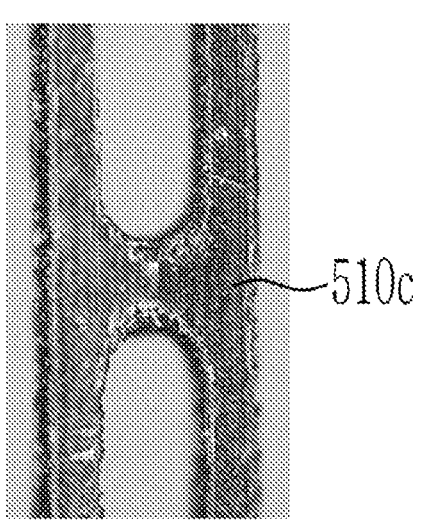

FIG. 12A is atop plan view of an embodiment of a supporting member, and FIGS. 12B, 12C and 12D are enlarged views of areas A1, A2 and A3 of the supporting member, respectively. The supporting member in an embodiment may be an FRP panel. The supporting member may include an edge portion 550 where the pattern of the through-holes 510*a*, 510*b*, and 510*c* extending in the folding axis F direction (the Y direction) ends. The supporting member includes a first region A1 including an edge portion 550 at opposite end portions, and may further include a second region A2 adjacent to the first region A1 in the folding axis direction y and not including a central portion, and a third region A3 adjacent to the second region A2 in the folding axis direction y and including the central portion. In the first region A1, the second region A2, and the third region A3, patterns of through-holes 510*a*, 510*b*, and 510*c* may be defined by differentiating the laser processing conditions, e.g., the laser pulse energy values or the laser scan times. The width of the affected zones disposed at the boundary of the through-holes 510*a*, 510*b*, and 510*c* defined in each region may be different.

The through-holes 510*a* using the laser of the lower pulse energy than the second and third regions A2 and A3 may be defined in the first region A1 including the edge portion 550. Accordingly, the through-holes 510*a* defined in the first region A1 hardly include the affected zone where the physical or chemical changes have occurred at the boundary, and the cut part is smooth, so that the defects related to the fiber material such as thread may be reduced. In an embodiment, the affected zone formed in the through-holes 510*a* of the first region A1 may occur over a region having a width of about 10 μm or less from the boundary of the through-hole 510*a*, for example.

The through-holes 510*b* using the laser of the relatively higher pulse energy than that of the first region A1 may be defined in the second region A2 adjacent to the first region A1. Accordingly, the through-holes 510*b* defined in the second region A2 may include the larger affected zone than the through-holes 510*a* defined in the first region A1. In an embodiment, the affected zone formed in the through-holes 510*b* of the second region A2 may occur over a region having the width of approximately about 10 μm to about 100 μm from the boundary of the through-hole 510*b*, for example.

The through-holes 510*c* may be defined using a laser of higher pulse energy than the second region A2 in the third region A3 adjacent to the second region A2 in the folding axis direction y and including the central portion of the supporting member. Accordingly, the through-holes 510*c* may include the affected zone of a larger area than the through-holes 510*b*. In an embodiment, the affected zone formed in the through-holes 510*c* of the third region A3 may occur over a region having the width of about 100 μm or more from the boundary of the through-hole 510*c*, for example.

As such, in the second region A2 and the third region A3, since the through-holes 510*b* and 510*c* using the laser of the relatively higher pulse energy than that of the first region A1 are defined, the number of the laser scans for forming the through-holes 510*b* and 510*c* may be reduced, and accordingly, the processing speed of the pattern may be increased.

Therefore, in the first region A1 including the edge portion 550, it is possible to increase the yield by reducing the defect rate such as the thread cutting, and to increase the productivity by minimizing the occurrence of the equipment error, in the second and third regions A2 and A3 that do not include the edge portion 550, the laser processing speed may be increased, so the overall process speed may be improved.

As such, the laser processing conditions may be varied throughout the pattern of the through-holes defined in the folding portion of the supporting member. In particular, the high-quality through-holes are processed by a laser of low pulse energy in the edge portion to reduce the defects and the equipment errors between the processes, and in the region not including the edge portion, the laser processing speed may be improved by the laser of higher pulse energy than the edge portion, thereby shortening the overall process time.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A foldable display device comprising:

a display panel including a foldable area which is folded based on a folding axis; and a supporting member disposed under the display panel and including:

a folding portion which corresponds to the foldable area of the display panel and in which a plurality of through-holes is defined, the folding portion comprising:

a first region including an edge portion in contact with an end portion of the supporting member; and a second region positioned adjacent to the first region in a folding axis direction; and a fiber reinforced plastic, wherein each of the plurality of through-holes includes an affected zone which is disposed at a boundary of a through-hole of the plurality of through-holes and in which a physical or chemical change has occurred at one surface of the supporting member, a width of the affected zone of through-holes of the plurality of through-holes disposed in the first region is different from a width of the affected zone of through-holes of the plurality of through-holes disposed in the second region, and the folding portion further includes a third region adjacent to the second region in the folding axis direction, and the width of the affected zone of the through-holes disposed in the third region is different from the width of the affected zone of the through-holes disposed in the second region.

2. The foldable display device of claim 1, wherein the width of the affected zone of the through-hole disposed in the first region is within about 10 micrometers from an incision surface of the through-hole.

3. The foldable display device of claim 1, wherein the plurality of through-holes is disposed consecutively and extended in the folding axis direction.

4. The foldable display device of claim 3, wherein the plurality of through-holes has a first width in the folding axis direction and a second width in a direction intersecting the folding axis direction, and the first width is wider than the second width.

5. The foldable display device of claim 4, wherein the plurality of through-holes is in a form of which a half circle is tangential to opposite ends of a rectangle.

6. The foldable display device of claim 1, wherein the fiber reinforced plastic includes at least one of carbon fiber reinforced plastic, glass fiber reinforced plastic, graphite fiber reinforced plastic, aramid fiber reinforced plastic, and hybrid carbon fiber reinforced plastic.

7. A foldable display device comprising:

a display panel including a foldable area which is folded based on a folding axis; and a supporting member disposed under the display panel and including:

a folding portion which corresponds to the foldable area of the display panel and in which a plurality of through-holes defined by a laser, the folding portion including:

a first region including an edge portion in contact with an end portion of the supporting member; and a second region disposed adjacent to the first region in a folding axis direction; and a fiber reinforced plastic, wherein through-holes of the plurality of through-holes disposed in the first region and through-holes of the plurality of through-holes disposed in the second region are processed by lasers of different pulse energy, and the through-holes disposed in the first region are processed with a laser of a first pulse energy, and the through-holes disposed in the second region are processed with a laser of a second pulse energy, which is a higher energy than the first pulse energy.

8. The foldable display device of claim 7, wherein a number of laser scans of the first pulse energy in the first region is different from a number of laser scans of the second pulse energy in the second region.

9. The foldable display device of claim 7, wherein the folding portion further includes a third region adjacent to the second region in the folding axis direction, the through-holes disposed in the first region are processed by a laser of a first pulse energy, the through-holes disposed in the second region are processed by a laser of a second pulse energy, which is higher energy than the first pulse energy, and the through-holes disposed in the third region are processed with a laser of a third pulse energy, which is a higher energy than the second pulse energy.

10. The foldable display device of claim 9, wherein a number of laser scans of the first pulse energy in the first region is greater than a number of laser scans of the second pulse energy in the second region, and a number of laser scans of the third pulse energy in the third region is smaller than the number of laser scans of the second pulse energy in the second region.

11. The foldable display device of claim 7, wherein the fiber reinforced plastic includes at least one of carbon fiber reinforced plastic, glass fiber reinforced plastic, graphite fiber reinforced plastic, aramid fiber reinforced plastic, and hybrid carbon fiber reinforced plastic.

12. A supporting member comprising:

a folding portion which is folded based on a folding axis and in which a plurality of through-holes is defined by laser processing, the folding portion including:

a first region including an edge portion in contact with an end portion of the supporting member; and a second region disposed adjacent to the first region in a folding axis direction, and a fiber reinforced plastic, wherein each of the plurality of through-holes includes an affected zone which is disposed at a boundary of a through-hole of the plurality of through-holes and in which a physical or chemical change has occurred at one surface of the supporting member, a width of the affected zone of through-holes of the plurality of through-holes disposed in the first region is different from a width of the affected zone of through-holes of the plurality of through-holes disposed in the second region, and the through-holes disposed in the first region are processed by a laser of a first pulse energy, and the through-holes disposed in the second region are processed by a laser of a second pulse energy different from the first pulse energy.

13. The supporting member of claim 12, wherein the folding portion further includes a third region adjacent to the second region in the folding axis direction, and a width of the affected zone of the through-holes disposed in the third region is different from the width of the affected zone of the through-holes disposed in the second region.

14. The supporting member of claim 12, wherein the width of the affected zone of the through-holes disposed in the first region is within about 10 micrometers from an incision surface of the through-holes.

15. The supporting member of claim 12, wherein the plurality of through-holes is formed consecutively and extended in the folding axis direction.

16. The supporting member of claim 12, wherein the fiber reinforced plastic includes at least one of carbon fiber reinforced plastic, glass fiber reinforced plastic, graphite fiber reinforced plastic, aramid fiber reinforced plastic, and hybrid carbon fiber reinforced plastic.

17. The supporting member of claim 12, wherein
a number of laser scans of the first pulse energy in the first
region is different from a number of laser scans of the
second pulse energy in the second region.

* * * * *